United States Patent
Noguchi

(10) Patent No.: US 7,763,874 B2
(45) Date of Patent: Jul. 27, 2010

(54) SIGNAL DETECTION CIRCUIT AND SIGNAL DETECTION METHOD, AND STATE DETECTION CIRCUIT

(75) Inventor: Masaki Noguchi, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 137 days.

(21) Appl. No.: 12/149,251

(22) Filed: Apr. 29, 2008

(65) Prior Publication Data

US 2009/0014631 A1    Jan. 15, 2009

(30) Foreign Application Priority Data

Jul. 12, 2007    (JP) ............... 2007-183485

(51) Int. Cl.
*H01J 40/14* (2006.01)
(52) U.S. Cl. ...................... 250/551; 307/117
(58) Field of Classification Search ............... 250/551, 250/214 R; 307/117
See application file for complete search history.

(56) References Cited

U.S. PATENT DOCUMENTS 4,368,385 A * 1/1983 Kanbe et al. ............... 250/551
4,390,790 A * 6/1983 Rodriguez ............... 250/551
4,700,060 A * 10/1987 Laiacona et al. ......... 250/214 R

FOREIGN PATENT DOCUMENTS

JP        9-8732       1/1997
JP        2002-57776   2/2002

* cited by examiner

*Primary Examiner*—Georgia Y Epps
*Assistant Examiner*—Tony Ko
(74) *Attorney, Agent, or Firm*—Staas & Halsey LLP

(57) ABSTRACT

A signal detection circuit comprises: a driving power source that drives a photosensor and applies a voltage to a mechanical switch, wherein the photosensor has a light-emitting device, and a light-receiving device to output an electric signal corresponding to an amount of light received from this light-emitting device, and the mechanical switch is connected in parallel between a power supply terminal of the photosensor and a signal output terminal of the photosensor and switchable between on and off states; and a detection means that is connected to the signal output terminal of the photosensor and that detects an electric signal output by the photosensor and an electric signal indicating the on/off state of the mechanical switch.

4 Claims, 4 Drawing Sheets

SIGNAL DETECTION CIRCUIT AND SIGNAL DETECTION METHOD, AND STATE DETECTION CIRCUIT

BACKGROUND OF THE INVENTION

1. Field of the Invention

The present invention relates to a signal detection circuit and a signal detection method for detecting an electric signal that is output by a photosensor and an electric signal that indicates an on/off state of a mechanical switch, wherein the photosensor has: a light-emitting device; and a light-receiving device that outputs an electric signal corresponding to an amount of light received from this light-emitting device, and the mechanical switch is switchable between on and off states. The present invention also relates to a state detection circuit for detecting a state of the electric signal that is output by the photosensor and the on/off state of the mechanical switch.

2. Description of the Related Art

A photosensor has: a light-emitting device; and a light-receiving device that outputs an electric signal corresponding to an amount of light received from the light-emitting device. The photosensor typically has three terminals. For example, when the light-emitting device is a photodiode and the light-receiving device is a phototransistor, an anode of the photodiode and an emitter of the phototransistor are connected to each other to constitute a power supply terminal of the photosensor. Further, a collector of the phototransistor from which the electric signal corresponding to the amount of light received from the photodiode constitutes a signal output terminal of the photosensor. Still further, a cathode of the photodiode acts as a terminal for connecting a photocurrent limiting resistor for adjusting a current flowing through the photodiode.

For example, as set forth in Japanese Unexamined Patent Publication No. 9-008732, the photosensor, which can output an electric signal corresponding to the amount of light that is received by a light-receiving device from the light-emitting device, is used in various fields.

Further, as set forth in Japanese Unexamined Patent Publication No. 2002-057776, a mechanical switch that is switchable between on and off states is similarly used in various fields.

When a photosensor is used, a dedicated signal detection circuit is needed for detecting the electric signal output by the photosensor. On the other hand, when a mechanical switch is used, another dedicated signal detection circuit is needed for detecting the electric signal output by the mechanical switch. Therefore, when the photosensor and the mechanical switch coexist with each other, respective dedicated signal detection circuits are needed, which results in an increase in the number of parts and an increase in price. In particular, in the case of a miniature electrical apparatus, it is often difficult to build respective dedicated signal detection circuits for the photosensor and mechanical switch therein due to limitations of space.

In view of the above problem, it is an object of the present invention to provide a signal detection circuit and a signal detection method in which one identical circuit can detect an electric signal output by a photosensor and an electric signal indicating an on/off state of a mechanical switch that is switchable between on and off states, and a state detection circuit in which one identical circuit can detect both a state of the electric signal output by the photosensor and the on/off state of the mechanical switch.

SUMMARY OF THE INVENTION

In order to achieve the above object, in a first aspect of the present invention, there is provided a signal detection circuit comprising: a driving power source that drives a photosensor and applies a voltage to a mechanical switch, wherein the photosensor has a light-emitting device, and a light-receiving device to output an electric signal corresponding to an amount of light received from this light-emitting device, and the mechanical switch is connected in parallel between a power supply terminal of the photosensor and a signal output terminal of the photosensor and switchable between on and off states; and a detection means that is connected with the signal output terminal of the photosensor and that detects an electric signal output by the photosensor and an electric signal indicating the on/off state of the mechanical switch.

In other words, the signal detection circuit according to the first aspect of the present invention comprises: a first connector pin that is connected to the power supply terminal of the photosensor and one terminal of the mechanical switch, wherein the photosensor has the light-emitting device, and the light-receiving device to output the electric signal corresponding to the amount of light received from this light-emitting device, and the mechanical switch is switchable between on and off states; a second connector pin that is connected to the signal output terminal of the photosensor and the other terminal of the mechanical switch; the driving power source that is connected to the first connector pin and that drives the photosensor and applies the voltage to the mechanical switch; and the detection means that is connected to the second connector pin and that detects the electric signal output by the photosensor and the electric signal indicating the on/off state of the mechanical switch.

A signal detection method based on this signal detection circuit comprises the steps of: supplying electric power, through the power supply terminal, to the photosensor and the mechanical switch, wherein the photosensor has the light-emitting device, and the light-receiving device to output the electric signal corresponding to the amount of light received from the light-emitting device, and the mechanical switch is connected in parallel between the power supply terminal of the photosensor and the signal output terminal of the photosensor and switchable between the on and off states; and detecting, through the signal output terminal of the photosensor, the electric signal output by the photosensor and the electric signal indicating the on/off state of the mechanical switch.

A state detection circuit comprises: the photosensor that has the light emitting device, and the light-receiving device to output the electric signal corresponding to the amount of light received from this light-emitting device; the mechanical switch that is connected in parallel between the power supply terminal of the photosensor and the signal output terminal of the photosensor and that is switchable between the on and off states; the driving power source that drives the photosensor and applies the voltage to the mechanical switch; and the detection means that is connected with the signal output terminal of the photosensor and that detects the electric signal output by the photosensor and the electric signal indicating the on/off state of the mechanical switch.

Further, in a second aspect of the present invention, a signal detection circuit for detecting an electric signal output by a photosensor and an electric signal indicating an on/off state of a mechanical switch, wherein the photosensor has a light-emitting device, and a light-receiving device to output an electric signal corresponding to an amount of light received from this light-emitting device, and the mechanical switch is switchable between the on and off states, comprises: the driving power source that drives the photosensor and applies a voltage to the mechanical switch that is connected in parallel between a power supply terminal of the photosensor and a terminal of the light-emitting device at the side opposite to the power supply terminal in the photosensor; and a detection means that is connected to a signal output terminal of the photosensor and that detects the electric signal output by the photosensor.

In other words, the signal detection circuit according to the second aspect of the present invention comprises: a first connector pin that is connected to the power supply terminal of the photosensor and one terminal of the mechanical switch, wherein the mechanical switch is connected in parallel between the power supply terminal of the photosensor and the terminal of the light-emitting device at the side opposite to the power supply terminal in the photosensor; a second connector pin that is connected to the signal output terminal of the photosensor; the driving power source that is connected to the first connector pin and that drives the photosensor and applies the voltage to the mechanical switch; and the detection means that is connected to the second connector pin and that detects the electric signal output by the photosensor.

A signal detection method based on this signal detection circuit comprises the steps of: supplying electric power, through the power supply terminal, to the photosensor and the mechanical switch, wherein the mechanical switch is connected in parallel between the power supply terminal of the photosensor and the terminal of the light-emitting device at the side opposite to the power supply terminal in the photosensor; and detecting, through the signal output terminal of the photosensor, the electric signal output by the photosensor.

At this time, a state detection circuit comprises: the photosensor that has the light emitting device, and the light-receiving device to output the electric signal corresponding to the amount of light received from the light-emitting device; the mechanical switch that is connected in parallel between the power supply terminal of the photosensor and the terminal of the light-emitting device at the side opposite to the power supply terminal in the photosensor and that is switchable between the on and off states; the driving power source that drives the photosensor and applies the voltage to the mechanical switch; and the detection means that is connected to the signal output terminal of the photosensor and that detects the electric signal output by the photosensor.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Figure 1:
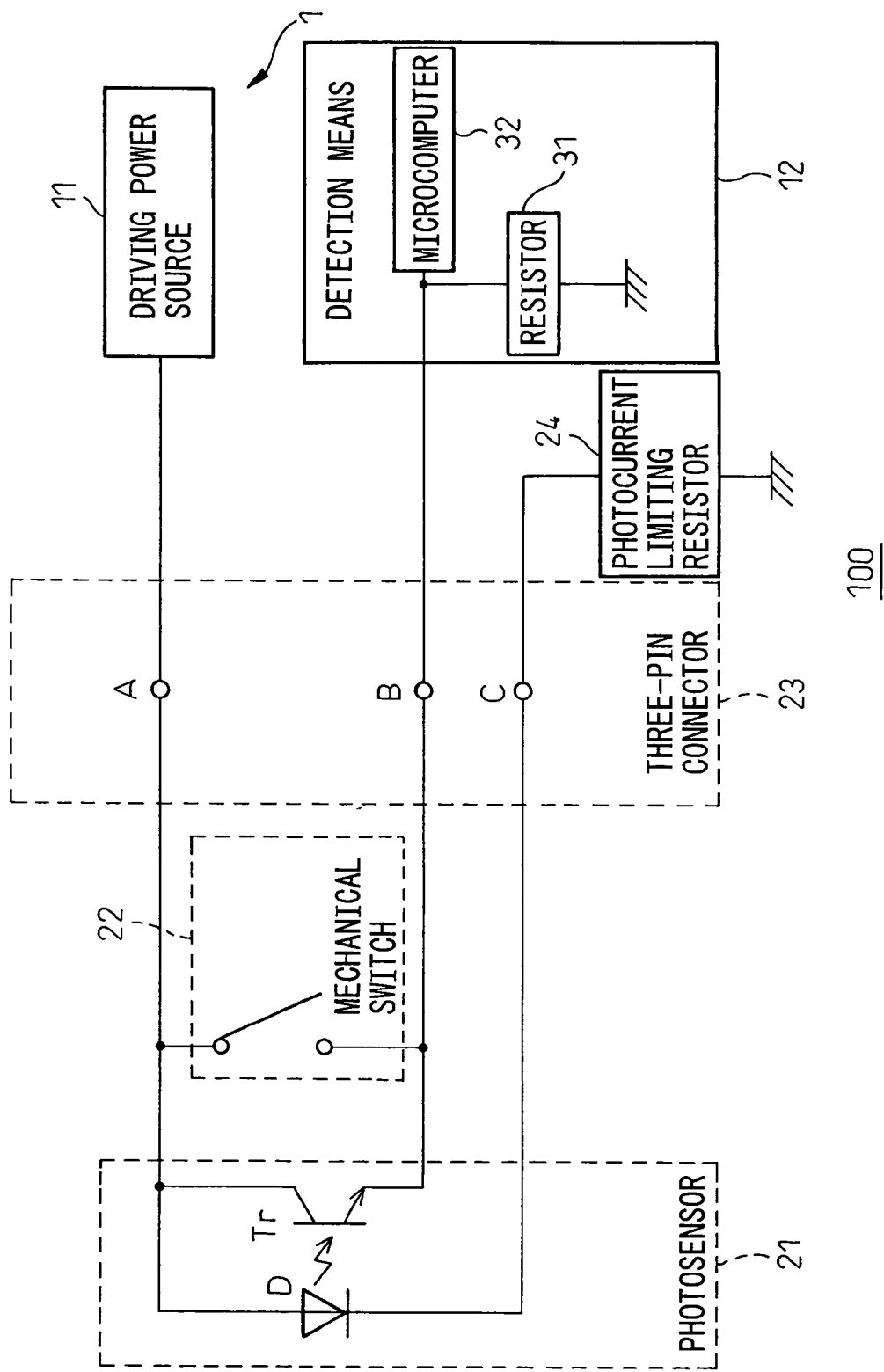
FIG. 1 is a basic principle diagram of a signal detection circuit and a state detection circuit according to a first embodiment of the present invention.

FIG. 1 is a basic principle diagram of a signal detection circuit and a state detection circuit according to a first embodiment of the present invention. Hereinafter, like reference numerals designate elements having like functions throughout the several views.

A signal detection circuit 1 according to a first embodiment comprises: a driving power source 11; and a detection means 12. The driving power source 11 drives a photosensor 21 and applies a voltage to a mechanical switch 22, wherein the photosensor 21 has: a photodiode D as a light-emitting device; and a phototransistor Tr as a light-receiving device to output an electric signal corresponding to an amount of light received from this photodiode D, and the mechanical switch 22 is connected in parallel between a power supply terminal of the photosensor 21 and a signal output terminal of the photosensor 21 and switchable between on and off states. Further, the detection means 12 is connected to the signal output terminal of the photosensor 21. The detection means 12 is comprised of a resistor 31 and a microcomputer 32 and detects an electric signal output by the photosensor 21 and an electric signal indicating the on/off state of the mechanical switch 22.

Thus, in the first embodiment of the present invention, a state detection circuit 100 comprises: the photosensor 21; the mechanical switch 22 that is connected in parallel between the power supply terminal of the photosensor 21 and the signal output terminal of the photosensor 21 and that is switchable between the on and off states; the driving power supply 11 that is connected to the power supply terminal of the photosensor 21 (i.e., an anode of the photodiode D and an emitter of the phototransistor Tr); and the detection means 12 that is connected to the signal output terminal of the photosensor 21 (i.e., a collector of the phototransistor Tr). A cathode of the photodiode D in the photosensor 21 is connected with a photocurrent limiting resistor 24 for adjusting a current flowing through the photodiode D.

For example, in order to implement the signal detection circuit 1, which comprises the driving power source 11 and the detection means 12, and the photocurrent limiting resistor 24 mounted on one identical substrate, it is convenient to connect the photosensor 21 and the mechanical switch 22 to the signal detection circuit 1 and the photocurrent limiting resistor 24 via a three-pin connector 23, as shown in FIG. 1. Thus, in this case, a pin A of the three-pin connector 23 is connected to the power supply terminal of the photosensor 21 and one terminal of the mechanical switch 22, and the driving power source 11 of the signal detection circuit 1. A pin B of the three-pin connector 23 is connected to the signal output terminal of the photosensor 21, the other terminal of the mechanical switch 22, and the detection means 12. A pin C of the three-pin connector 23 is connected to the cathode of the photodiode D in the photosensor 21, and the photocurrent limiting resistor 24.

Figure 2:
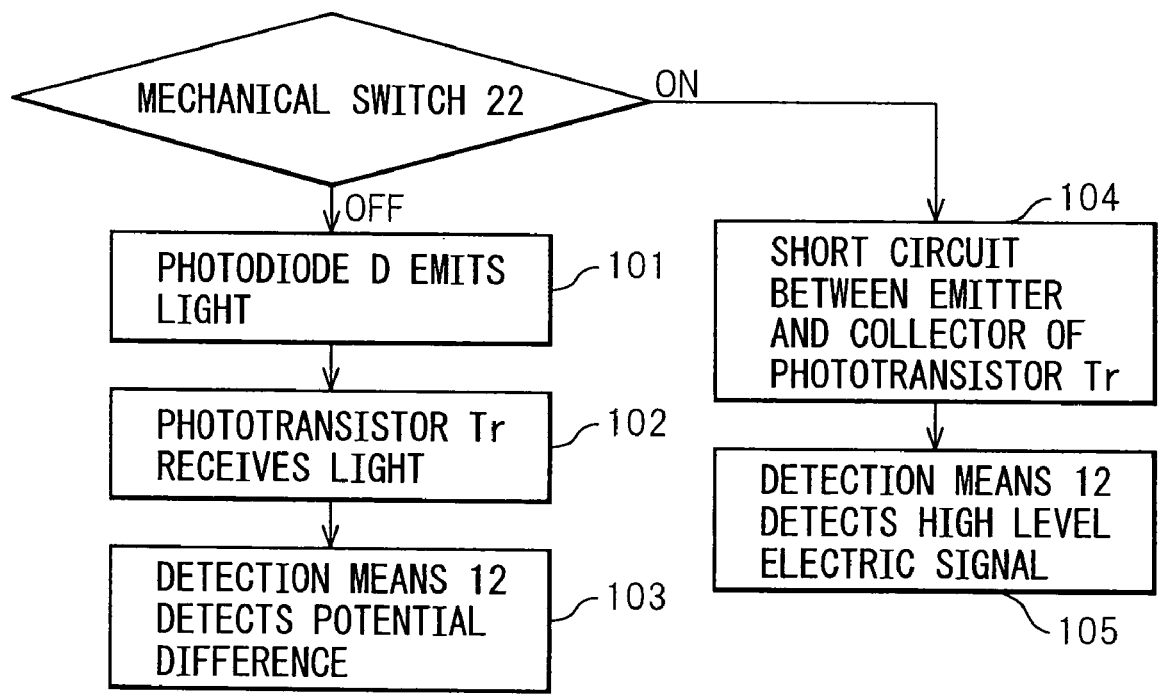
FIG. 2 is a state transition diagram describing an operating principle of the signal detection circuit according to the first embodiment of the present invention shown in FIG. 1.

FIG. 2 is a state transition diagram describing an operating principle of the signal detection circuit according to the first embodiment of the present invention shown in FIG. 1.

The driving power source 11 of FIG. 1 supplies the electric power to the photosensor 21 and applies the voltage to the mechanical switch 22 via the pin A of the three-pin connector 23.

When the mechanical switch 22 is switched off, due to the electric power supply to the photosensor 21, a current that is appropriately adjusted by the photocurrent limiting resistor 24 flows through the photodiode D in the photosensor 21, so that the photodiode D emits light (state 101 in FIG. 2). The phototransistor Tr in the photosensor 21 receives the light emitted by the photodiode D (state 102 in FIG. 2). Then, a current corresponding to the amount of light received from the photodiode D is output from the collector of the phototransistor Tr in the photosensor 21. This current causes a potential difference across the resistor 31 in the detection means 12. The microcomputer 32 in the detection means 12 detects this potential difference via an AD port (state 103 in FIG. 2). As described above, when the mechanical switch 22 is switched off, the detection means 12 detects the electric signal output by the photosensor 21. The electric signal that is output by the photosensor 21 and detected by the detection means 12 corresponds to the amount of light received by the phototransistor Tr from the photodiode D, and therefore, its signal level is not a simple high (H) or low (L) level but a so-called "intermediate" signal level falling in a range between the high and low levels. In other words, in the first embodiment of the present invention, when the detection means 12 detects any "intermediate" voltage signal level, it means that the signal is output as a result of the operation of the photosensor 21 and the mechanical switch 22 is in the off state.

On the other hand, when the mechanical switch 22 is switched on, a short circuit occurs between the emitter and the collector of the phototransistor Tr in the photosensor 21 (state 104 in FIG. 2), and therefore, no current flows from the collector of the phototransistor Tr in the photosensor 21. In this case, the voltage of the driving power source 11 is applied to the resistor 31 in the detection means 12 without change. The microcomputer 32 in the detection means 12 detects this potential as a high level electric signal via the AD port (state 105 in FIG. 2). As described above, when the mechanical switch 22 is switched on, the detection means 12 detects the high level electric signal indicating that the mechanical switch 22 is in the on state. In other words, in the first embodiment of the present invention, when the detection means 12 detects the high level electric signal, it means that the mechanical switch 22 is in the on state.

As described above, according to the first embodiment of the present invention, one identical signal detection circuit can detect whether the mechanical switch is switched on or not, and when the mechanical switch is switched off, it can detect the sensor output signal of the photosensor. Therefore, the first embodiment of the present invention can be applied to an electrical apparatus in which a photosensor and a mechanical switch coexist with each other, wherein, when the mechanical switch is in an on state, an output signal of the photosensor is not needed and, when the mechanical switch is in an off state, it is desired to detect the output signal of the photosensor.

Figure 3:
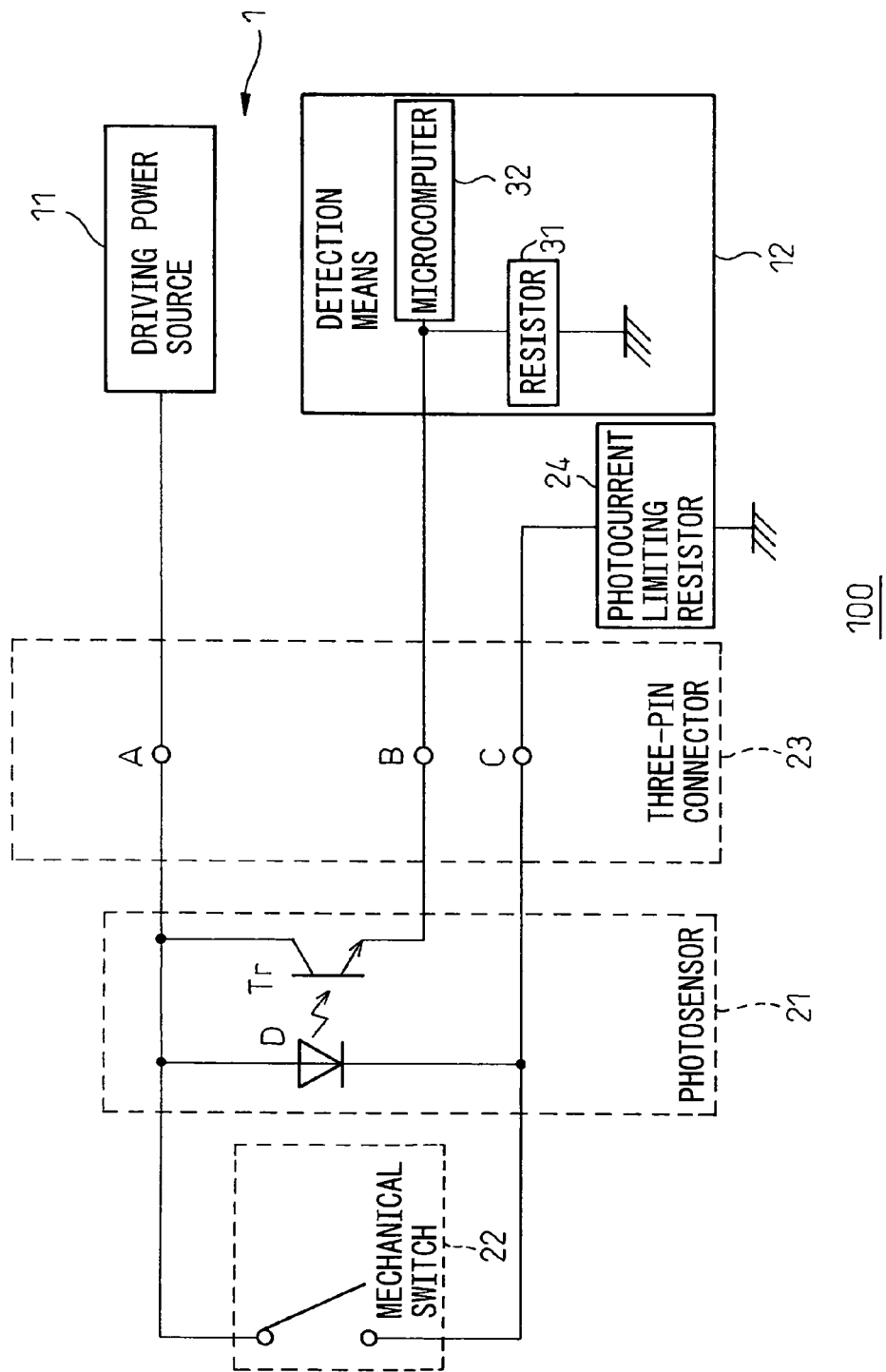
FIG. 3 is a basic principle diagram of a signal detection circuit and a state detection circuit according to a second embodiment of the present invention.
Figure 5:
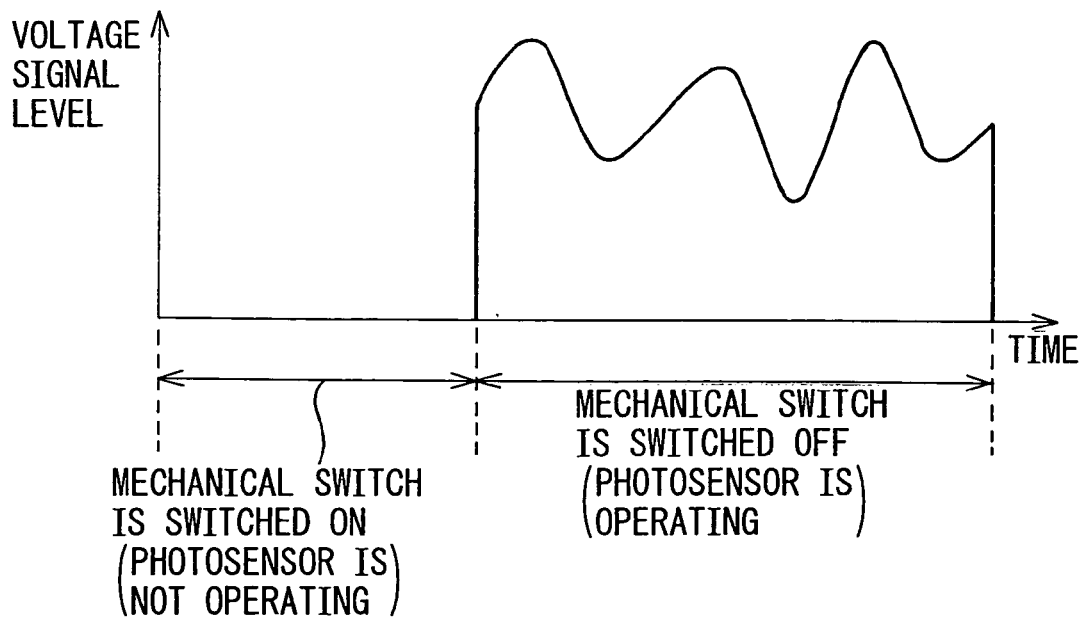
FIG. 5 is a diagram illustrating an electric signal level detected by the signal detection circuit according to the second embodiment of the present invention.

FIG. 3 is a basic principle diagram of a signal detection circuit and a state detection circuit according to a second embodiment of the present invention. Further, FIG. 5 is a diagram illustrating an electric signal level detected by the signal detection circuit according to the second embodiment of the present invention.

A signal detection circuit 1 according to a second embodiment comprises: a driving power source 11; and a detection means 12. The driving power source 11 drives a photosensor 21 and applies a voltage to a mechanical switch 22, wherein the photosensor 21 has: a photodiode D as a light-emitting device; and a phototransistor Tr as a light-receiving device to output an electric signal corresponding to an amount of light received from this photodiode D, and the mechanical switch 22 is connected in parallel between a power supply terminal of the photosensor 21 and a terminal of the photodiode D at the side opposite to the power supply terminal of the photosensor 21 (i.e., a cathode of the photodiode D) and switchable between on and off states. Further, the detection means 12 is connected to a signal output terminal of the photosensor 21. The detection means 12 is comprised of a resistor 31 and a microcomputer 32 and detects an electric signal output from the photosensor 21.

Thus, in the second embodiment of the present invention, a state detection circuit 100 comprises: the photosensor 21; the mechanical switch 22 that is connected in parallel between the power supply terminal of the photosensor 21 and the cathode of the photodiode D in the photosensor 21; the driving power supply 11 that is connected to the power supply terminal of the photosensor 21 (i.e., an anode of the photodiode D and an emitter of the phototransistor Tr); and the detection means 12 that is connected to the signal output terminal of the photosensor 21 (i.e., a collector of the phototransistor Tr). The cathode of the photodiode D in the photosensor 21 is connected to a photocurrent limiting resistor 24 for adjusting a current flowing through the photodiode D.

For example, in order to implement the signal detection circuit 1, which comprises the driving power source 11 and the detection means 12, and the photocurrent limiting resistor 24 mounted on one identical substrate, it is convenient to connect the photosensor 21 and the mechanical switch 22 to the signal detection circuit 1 and the photocurrent limiting resistor 24 via a three-pin connector 23, as shown in FIG. 3. Thus, in this case, a pin A of the three-pin connector 23 is connected to the power supply terminal of the photosensor 21 and one terminal of the mechanical switch 22, and the driving power source 11 of the signal detection circuit 1. A pin B of the three-pin connector 23 is connected with the signal output terminal of the photosensor 21 and the detection means 12. A pin C of the three-pin connector 23 is connected to the cathode of the photodiode D in the photosensor 21, the other terminal of the mechanical switch 22, and the photocurrent limiting resistor 24.

Figure 4:
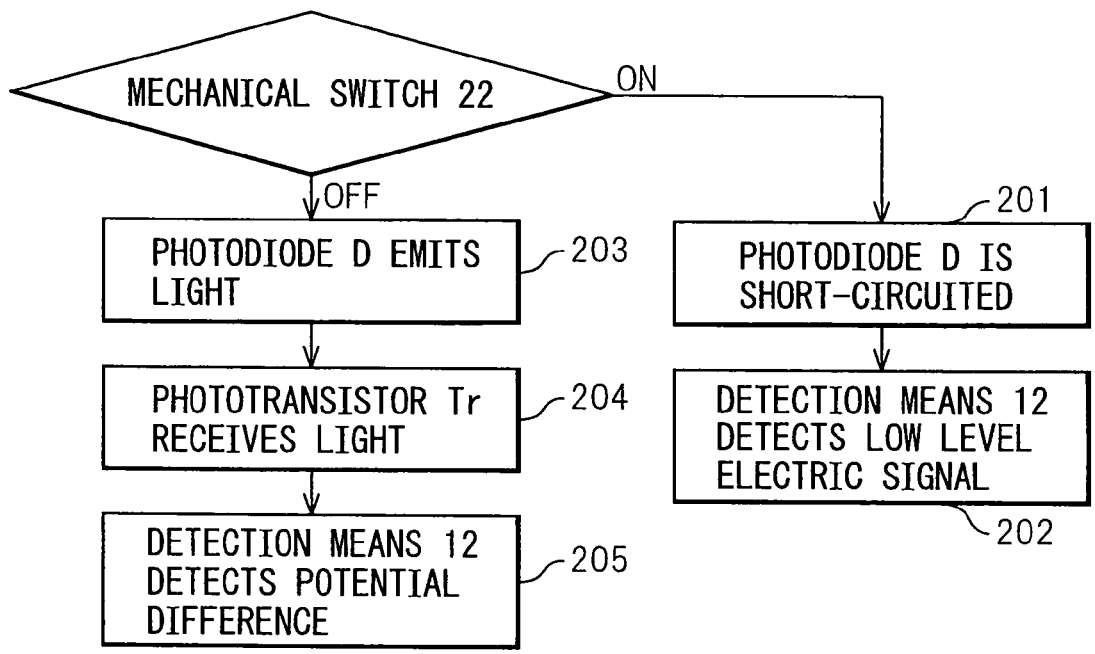
FIG. 4 is a state transition diagram describing an operating principle of the signal detection circuit according to the second embodiment of the present invention shown in FIG. 3.

FIG. 4 is a state transition diagram describing an operating principle of the signal detection circuit according to the second embodiment of the present invention shown in FIG. 3.

The driving power source 11 of FIG. 3 supplies the electric power to the photosensor 21 and applies the voltage to the mechanical switch 22 via the pin A of the three-pin connector 23.

When the mechanical switch 22 is switched on, the photodiode D in the photosensor 21 is short-circuited (state 201 in FIG. 4), and therefore, no current flows from the collector of the phototransistor Tr in the photosensor 21. Therefore, no potential difference occurs across the resistor 31 in the detection means 12, so that the microcomputer in the detection means 12 detects a zero voltage or, in other words, a low level voltage signal via an AD port (state 202 in FIG. 4). As described above, when the mechanical switch 22 is switched on, the detection means 12 detects the low level (zero voltage) electric signal as shown in FIG. 5. In other words, in the second embodiment of the present invention, when the detection means 12 detects the low level electric signal, it means that the mechanical switch 22 is in the on state.

On the other hand, when the mechanical switch 22 is switched off, due to the electric power supply to the photosensor 21, a current that is appropriately adjusted by the photocurrent limiting resistor 24 flows through the photodiode D in the photosensor 21, so that the photodiode D emits light (state 203 in FIG. 4). The phototransistor Tr in the photosensor 21 receives the light emitted by the photodiode D (state 204 in FIG. 4). Then, a current corresponding to the amount of light received from the photodiode D is output from the collector of the phototransistor Tr in the photosensor 21. This current causes a potential difference across the resistor 31 in the detection means 12. The microcomputer 32 in the detection means 12 detects this potential difference via an AD port (state 205 in FIG. 4). As described above, when the mechanical switch 22 is switched off, the detection means 12 detects the electric signal output by the photosensor 21. The electric signal that is output by the photosensor 21 and detected by the detection means 12 corresponds to the amount of light received by the phototransistor Tr from the photodiode D and, therefore, as shown in FIG. 5, its signal level is not a simple high (H) or low (L) level but a so-called "intermediate" signal level falling in a range between the high and low levels. In other words, in the second embodiment of the present invention, when the detection means 12 detects any "intermediate" voltage signal level, it means that the signal is output as a result of the operation of the photosensor 21 when the mechanical switch 22 is in the off state.

As described above, according to the second embodiment of the present invention, one identical signal detection circuit can detect whether the mechanical switch is switched on or not, and when the mechanical switch is switched off, it can detect the sensor output signal of the photosensor.

As described above, the first and second embodiments of the present invention can be applied to an electrical apparatus in which a photosensor and a mechanical switch coexist with each other, wherein, when the mechanical switch is in an on state, an output signal of the photosensor is not needed, and when the mechanical switch is in an off state, it is desired to detect the output signal of the photosensor.

A thermal printer is an example of an electrical apparatus to which the first and second embodiments of the present invention can be applied. For example, a mechanical switch can detect whether paper comes in contact with a platen of the thermal printer or not. A state in which the paper is set is assigned to an on state of the mechanical switch and a state in which the paper is not set is assigned to an off state of the mechanical switch. Then, an output signal of the photosensor when the paper is set is assigned to detection of a mark of the paper. In contrast to the conventional art in which independent signal detection circuits have to be provided for the detection of the setting of the paper and of the mark of the paper, according to the first and second embodiments of the present invention, these tasks can be implemented by using only one signal detection circuit.

A folding cellular phone is another example of an electrical apparatus to which the first and second embodiments of the present invention can be applied. For example, a mechanical switch can detect whether the body of the cellular phone is unfolded or not. A state in which the body of the cellular phone is folded is assigned to an on state of the mechanical switch and a state in which the body of the cellular phone is unfolded is assigned to an off state of the mechanical switch. Then, when the body of the cellular phone is unfolded, for example, an output signal of a photosensor is assigned to detection of illumination around the cellular phone. In this case, when a signal of any voltage level is detected, it means that the body of the cellular phone is unfolded, and therefore, it is possible to detect whether the body is folded or unfolded without malfunction. A similar configuration can be applied to detection of whether a door of an electric train or a bus is opened or closed which contributes to security of passengers.

The present invention can be applied to a signal detection circuit for a photosensor and a mechanical switch in an electrical apparatus in which the photosensor and the mechanical switch coexist with each other. According to the present invention, it is not necessary to independently configure one signal detection circuit for detecting an electric signal output by the photosensor and the other signal detection circuit for detecting an on/off state of the mechanical switch that is switchable between the on and off states, and therefore, one identical signal detection circuit can detect both electric signals. Thus, according to the present invention, one identical signal detection circuit can detect whether the mechanical switch is switched on or not, and when the mechanical switch is switched off, it can detect the sensor output signal of the photosensor.

Therefore, even when the photosensor and the mechanical switch coexist with each other, the signal detection circuit can be configured at a low cost and without increasing the number of parts. Miniaturization of the electrical apparatus is made possible by use of the photosensor and the mechanical switch.

By way of example, the present invention can be applied to a signal detection circuit of a photosensor and a mechanical switch in an electrical apparatus such as a thermal printer, a folding cellular phone, a door opening/closing apparatus for an electric train or a bus, and the like.

What is claimed is:

1. A state detection circuit comprising:
a photosensor that has a light-emitting device, and a light-receiving device to output an electric signal corresponding to an amount of light received from such light-emitting device;
a mechanical switch that is connected in parallel between a power supply terminal of said photosensor and a signal output terminal of said photosensor and that is switchable between on and off states;
a driving power source that drives said photosensor and applied a voltage to said mechanical switch; and
a detection means that is connected with said signal output terminal of said photosensor and that detects an electric signal output by said photosensor and an electric signal indicating the on/off state of said mechanical switch.

2. A signal detection circuit comprising:
a driving power source that drives a photosensor and applies a voltage to a mechanical switch, wherein said photosensor has a light-emitting device, and a light-receiving device to output an electric signal corresponding to an amount of light received from such light-emitting device, and said mechanical switch is connected in parallel between a power supply terminal of said photosensor and a signal output terminal of said photosensor and switchable between on and off states; and
a detection means that is connected to the signal output terminal of the photosensor and that detects an electric signal output by the photosensor and an electric signal indicating the on/off state of the mechanical switch.

3. A signal detection circuit comprising:
a first connector pin that is connected to a power supply terminal of a photosensor and one terminal of a mechanical switch, wherein said photosensor has a light-emitting device, and a light-receiving device to output an electric signal corresponding to an amount of light received from such light-emitting device, and said mechanical switch is switchable between on and off states;
a second connector pin that is connected to a signal output terminal of said photosensor and the other terminal of the mechanical switch;
a driving power source that is connected to said first connector pin and that drives said photosensor and applies a voltage to said mechanical switch; and a detection means that is connected to said second connector pin and that detects an electric signal output by the photosensor and an electric signal indicating the on/off state of the mechanical switch.

4. A signal detection method comprising the steps of:

supplying electric power, through a power supply terminal, to a photosensor and a mechanical switch, wherein said photosensor has a light-emitting device, and a light-receiving device to output an electric signal corresponding to an amount of light received from such light-emitting device, and said mechanical switch is connected in parallel between said power supply terminal of said photosensor and a signal output terminal of said photosensor and switchable between on and off states; and detecting, through said signal output terminal of said photosensor, an electric signal output by said photosensor and an electric signal indicating the on/off state of said mechanical switch.

* * * * *